United States Patent [19]

Atoh

[11] Patent Number: 5,177,671
[45] Date of Patent: Jan. 5, 1993

[54] CHIP CARRIER SOCKET

[75] Inventor: Kiyoshi Atoh, Tokyo, Japan

[73] Assignee: Kel Corporation, Tokyo, Japan

[21] Appl. No.: 771,350

[22] Filed: Oct. 4, 1991

Related U.S. Application Data

[62] Division of Ser. No. 468,718, Jan. 23, 1990, Pat. No. 5,055,972.

[51] Int. Cl.⁵ ............... H05K 7/02; H01L 23/055; H01R 9/09
[52] U.S. Cl. .................. 361/392; 174/52.4; 361/400; 361/417; 439/71; 257/693; 439/71
[58] Field of Search ............... 361/392, 393, 395, 400, 361/413, 394, 399, 421; 439/68, 70, 71, 72, 73; 174/52.1, 52.2, 52.3, 52.4, 138 G, 253, 260; 357/69, 70, 72, 73, 74, 80

[56] References Cited

U.S. PATENT DOCUMENTS 4,934,944  6/1990  Kozel et al. ............... 439/68
5,055,972 10/1991  Atoh ........................ 361/400

Primary Examiner—Leo P. Picard
Assistant Examiner—D. Sparks
Attorney, Agent, or Firm—Robert W. J. Usher

[57] ABSTRACT

A chip carrier socket comprises a one piece insulating housing with a rectangular frame-like body portion surrounding a rectangular base-plate. Rows of contacts are force-fitted in cavities in the body portion with contact spring portions extending inwardly for electrical connection to leads on respective sides of a chip carrier inserted in the socket and with rows of soldering tabs extending inwardly at the circuit board engaging face for reflow soldering to pads of the circuit board. The base-plate is supported on the body portion with respective perimetrical edges thereof located spaced apart from the respective adjacent sides of the body portion, defining therewith apertures aligned over the respective rows of solder tabs, by bridge portions which extend between respective corners of the base-plate and adjacent respective corners of the frame-like body portion without obstruction of the field of view along the apertures. Circuit board engaging feet formed as continuations of respective bridges depend from corners of the base-plate for supporting the base-plate at a predetermined spacing above the surface of the circuit board. Chip carrier supporting projections upstand from respective corners of an upper surface thereof in a common, horizontal plane, at locations adjacent and diagonally aligned with the respective bridges.

12 Claims, 2 Drawing Sheets

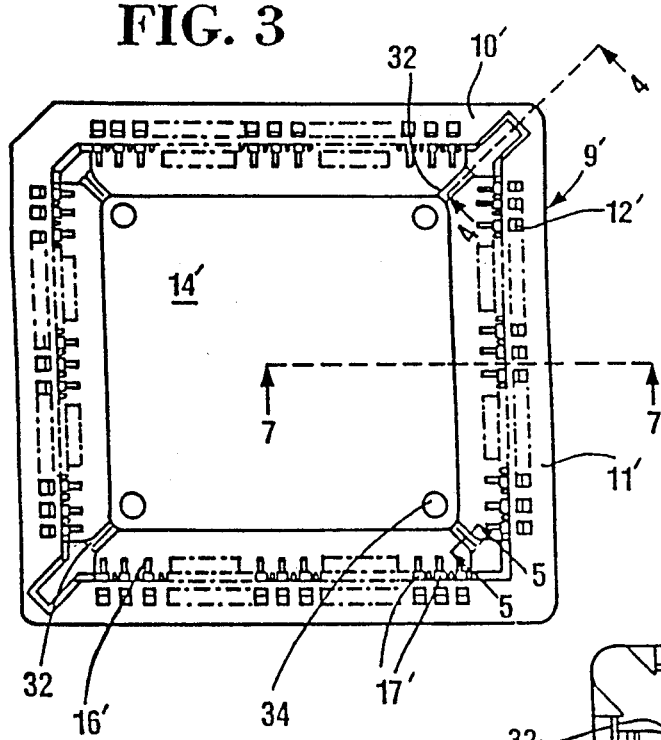
FIG. 3
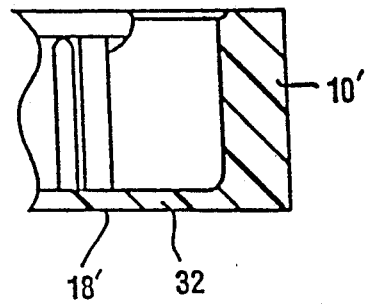
FIG. 4
FIG. 5
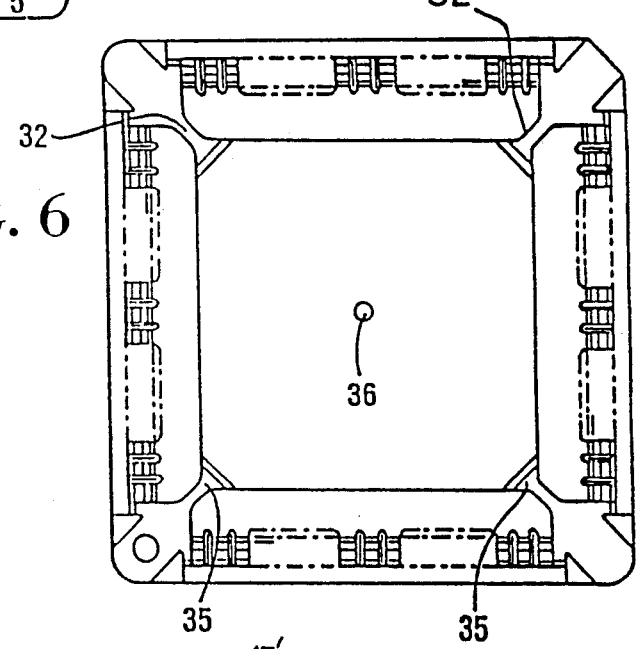
FIG. 6
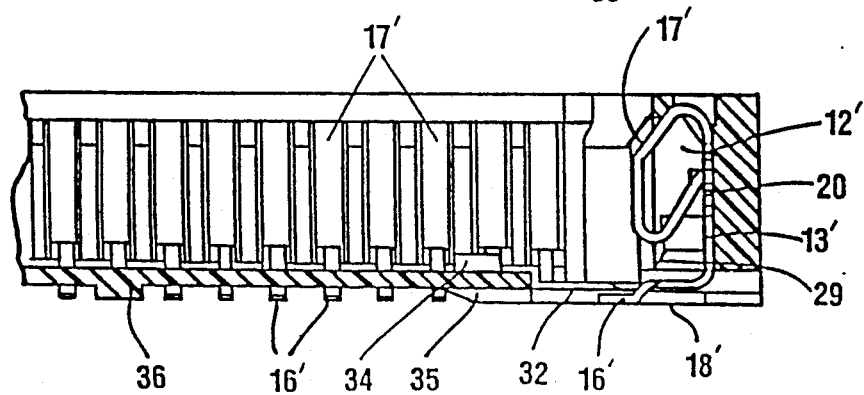
FIG. 7

5,177,671

CHIP CARRIER SOCKET

This application is a division of Ser. No. 07/468,718, filed Jan. 23, 1990 and issued on Oct. 8, 1991 as U.S. Pat. No. 5,055,972.

FIELD OF THE INVENTION

The invention relates to a chip carrier socket for mounting a chip carrier on a printed circuit board.

BACKGROUND OF THE INVENTION

Chip carrier sockets are widely used for mounting the increasingly complex microprocessor chip carriers on circuit boards. It is well recognized that in view of the increasing miniaturization of electronic equipment including, in particular, computer processors, such chip carrier sockets must be of small size and of low profile to occupy a minimum of circuit board space and permit stacking of circuit boards in closely spaced, face-to-face relation while firmly mounting the chip carrier therein, reliably electrically connected to the circuit board. At the same time, the chip carrier sockets must be capable of manufacture at low cost and of application to the circuit board using economical mass production, automatic handling techniques.

In an attempt to meet such requirements, a widely known type of chip carrier socket comprises an insulating housing molded in one piece of plastic material with a rectangular frame-like body portion surrounding a central base-plate. The sides of the body portion are formed with respective rows of contact receiving cavities which open both inwardly towards a chip carrier receiving area within the profile of the frame-like body above the base-plate and downwardly to a lower, circuit board engaging face. Respective contacts are inserted into respective cavities through such lower face openings and force-fitted in the respective cavities with their contact spring portions extending through the inner openings in rows for establishing electrical connection to respective leads of rows of leads on respective sides of a rectangular chip carrier inserted into the chip carrier socket through an upper face, and with soldering tabs of the contacts extending inwardly of the frame-like body portion at the board engaging face for soldered connection by the common reflow soldering technique to respective soldering pads arranged closely spaced in rows on the circuit board.

In order to avoid heat produced during soldering being transferred from the soldered connections to the relatively thin base-plate and to afford access to the rows of tabs for a tool to correct any faulty soldering, respective perimetrical edges of the base-plate are located spaced apart from the respective adjacent sides of the frame body defining therebetween apertures aligned over the solder tabs. At the same time, the base-plate is spaced above the circuit board engaging face both to avoid deforming heat transfer thereto and to enable unimpeded washing of the board surface underneath the base-plate.

When connecting the chip carrier socket to the circuit board, the chip carrier socket is arranged on the circuit board and the solder tabs are pressed against the reflow-solder on the respective pads of the circuit board by pushing the frame-like body or the base-plate with a jig while heat is applied to the circuit board.

In one particular known construction, the base-plate is supported by the perimetrical edges thereof being joined to respective sides of the frame-like body portion by a series of bridges which extend spaced above and between adjacent of the contact tabs at substantially equally spaced apart intervals to each side of the frame-like body portion across the aperture thereby evenly supporting the base-plate at a multiplicity of closely spaced locations completely around its periphery conjointly to withstand forces applied thereto during insertion of the chip carrier into the chip carrier socket and stresses produced by the soldering process. Portions of the bridges adjoining the frame-like body portion are of increased height providing stand-offs supportingly engaging the underside of a chip carrier to maintain the chip carrier horizontal during insertion to obviate risk of damage to either the relatively weak base-plate, the contacts or to the bridges themselves arising from uneven insertion into the chip carrier socket.

However, a disadvantage of such known construction is that the the bridges span the rows of contact tabs and pads obstructing the field of view of a quality control inspector checking the accuracy of the soldering, particularly for solder bridges formed by the gel-like solder being forced between adjacent pads by the pressure applied during soldering. Such solder bridges may be hidden directly under the housing bridges as the housing bridges are located between adjacent tabs to avoid obstructing the insertion of the contacts into the cavities of the frame-like body. In addition, the presence of the bridges over the soldering rows may increase the possibility of solder wicking or otherwise being forced thereunder.

Furthermore, the presence of the bridges may hinder the free access of a soldering tool during correction of soldering faults with consequential increases in labor costs and slowing of production.

OBJECTS OF THE INVENTION

It is an object of the invention to provide a chip carrier socket in which the above-mentioned disadvantages are eliminated or ameliorated.

In particular, it is an object of the invention to avoid the obstruction of the field of view of the quality control inspector along the rows of soldered tabs and pads thereby to minimize the risk of a solder bridge being undetected while ensuring that the relatively thin base-plate is adequately supported spaced apart from the soldering rows and spaced above the surface of the circuit board.

It is a further object of the invention to avoid risk of the corrective soldering process being hampered by the bridges.

SUMMARY OF THE INVENTION

According to the invention, in a chip carrier socket of the generally known type described above, the central base-plate is integrally joined to the rectangular frame body by only four bridge portions extending between respective corners of the central base-plate and the adjacent respective corners of the frame-like body portion and the base-plate is formed with circuit board engaging feet which depend from respective corners of a lower face of the base-plate and from central location thereof for supporting engagement with the surface of a printed circuit board, whereby the base-plate is supportively joined to the frame part of the body portion without obstruction of the field of view along the respective soldered rows aligned with the apertures.

Preferably, the bridges extend in the same horizontal plane of the feet for engagement with the circuit board at the circuit boar engaging face.

The provision of the bridges extending between only the respective corners of the base-plate and the frame-like body part enables the rows of soldered pads along respective sides and the bridges to be readily inspected as the inspector has an unobstructed field of view along each aperture. At the same time, the base-plate remains sufficiently supported spaced above the printed circuit board by the feet without risk of fracture of the bridges.

In addition, the risk of a solder bridge may also be reduced as the housing bridges engage the circuit board face. Furthermore, as the bridge extends in the plane of the board engaging surface, the risk of fracture thereof during chip carrier insertion is further reduced and the risk of solder passing and entrapped thereunder is avoided.

In addition, there is no risk of the bridges obstructing movement of the corrective soldering tool in the aperture.

Preferably, chip supporting projections upstand from respective corners of an upper surface of the base-plate, adjacent and diagonally aligned with the respective bridges.

The provision of the chip supporting projections and board engaging feet on the base-plate itself ensures support for the chip carrier, obviating the risk of damage in the event of uneven insertion thereof while also not obstructing the field of view along the apertures or contact rows. The positioning of the respective chip carrier supporting projections and base-plate supporting feet adjacent and in diagonal alignment with the bridges assists in ensuring minimum transfer of stress to the relatively thin base-plate and bridges.

BRIEF DESCRIPTION OF THE DRAWINGS

FIG. 3 is a schematic plan view of a chip carrier socket according to the invention;

FIG. 4 is a fragmentary cross-sectional view of the chip carrier socket taken along line 4—4 of FIG. 3;

FIG. 5 is a fragmentary cross-sectional view of the chip carrier socket taken along line 5—5 of FIG. 3;

FIG. 6 is an underplan view of the chip carrier socket with the contacts omitted;

FIG. 7 is a cross-sectional view of the chip carrier socket taken along line 7—7 of FIG. 3.

As shown in FIGS. 1 and 2, one type of a widely known and used chip carrier socket comprises an insulating housing 9 molded in one piece of plastic material to provide a rectangular frame-like body portion 10 surrounding a central base-plate 14. The frame-like body portion has sides 11 formed, respectively, with rows of cavities 12 for contacts 13 having board connecting solder tab portions 16 and contact spring portions 17. The cavities open both inwardly towards the chip receiving area above the base-plate and downwardly towards a lower, board engaging face 18 through which the respective contacts can be inserted into the respective cavities so that the solder tab portions 16 extend horizontally from the lower opening at the board engaging face protruding slightly below the plane thereof for connection to respective soldering pads of a circuit board 19 by a reflow soldering technique and contact portions 17 protrude inwardly for establishing electrical connection to respective leads of rows of leads on respective sides of the common rectangular chip carrier inserted into the chip carrier socket.

The base-plate 14 is supported spaced above the board engaging face and with respective perimetrical edges 21 thereof spaced from the respective adjacent sides of the frame-like body portion to define therebetween apertures 22, by a multiplicity of bridges 24 spanning the apertures. The bridges 24 are spaced above the plane of the contact tabs and the board engaging face and integrally join respective sides of the frame-like body portion to the adjacent perimetrical edges conjointly providing sufficient support for the base-plate to withstand forces applied thereto during insertion of the chip carrier. Portions 27 of the bridges adjoining the frame-like body are of increased height providing standoffs engaging the underside of a chip carrier.

A disadvantage of the prior construction is that, although the bridges provide effective support for the base-plate, the bridges obstruct the quality control inspector's field of view along the apertures and contact rows hindering the inspector from detecting imperfections in soldering, especially any solder bridges formed between adjacent solder pads by the pressure of the reflow soldering process.

Figure 1:
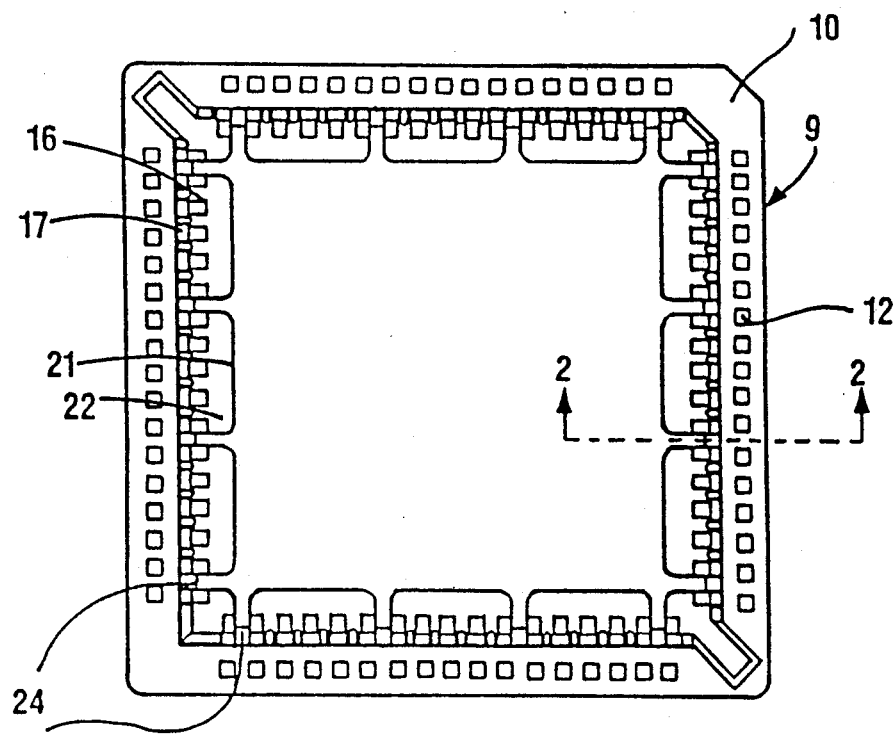
FIG. 1 is a schematic plan view of one particular chip carrier socket of a known type.
Figure 2:
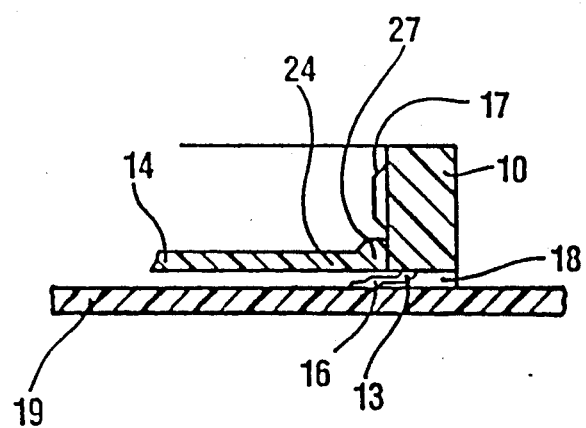
FIG. 2 is a schematic cross-sectional view taken along line 2—2 of FIG. 1.

In the preferred embodiment of the present invention, illustrated in FIGS. 3-7, primed reference numerals are used, where appropriate, for elements similar to those in FIGS. 1 and 2.

In the chip carrier socket according to the present invention, a base-plate 14' is integrally joined to a frame-like body portion 10' of a one-piece molded housing 9' by four bridges 32 which extend in the plane of the circuit board engaging face 18' between only the respective corners of the base-plate 14' and the corners 33 of the frame part. Chip carrier supporting projections 34 upstand from respective corners of the upper surface of the base-plate, adjacent and diagonally aligned with respective bridges. Board engaging feet 35 are formed on respective corners of a lower face of the base-plate as continuations of the respective bridges where they join the base-plate and a single circuit board engaging foot 36 depends from the center of the underside of the base-plate.

As shown in FIG. 7, each contact is of a generally known type being stamped and formed in one piece from sheet metal stock and having a strip-form, generally central, body part provided with ears or tangs 20 on respective opposite edges which engage opposite side walls of respective cavities enabling the contact to be anchored therein as a press fit when inserted into the cavity through the opening to the board engaging face. A reversely bent, lead engaging contact spring portion 17' forming a loop extends from one longitudinal end of the body part and a stepped portion extends laterally from the other end of the body part terminating in a horizontally extending soldering tab 16'. As well known, the contacts are prestressed by camming engagement of a flange extending from an edge of the contact spring loop with a camming surface 29 of the housing during insertion into the cavities while attached to a carrier strip, which is subsequently removed.

It will be commonly understood that, although not shown in the drawings, when the contacts are fully inserted into the cavities, the soldering tabs 16' protrude slightly below the plane of the housing at the board engaging face prior to application to the circuit board and are flexed relatively upwardly slightly by being pressed against the circuit board during connection thereto.

As the bridges extend diagonally only in the corners of the chip carrier socket housing, effective support for the base-plate is provided without obstructing the inspector's field of view along the soldered tab rows, enabling speedy and accurate detection of soldering faults, including any soldering bridges formed between adjacent solder pads. In addition, as the bridges are located only in the corners of the housing, they can lie in the same plane as the board engaging face without overlying a circuit board pad or impeding contact insertion. Thus, the bridges find support by engagement with the circuit board itself reducing their risk of fracture when pressure is applied to the chip carrier socket during insertion of the chip carrier. Furthermore, the bridges themselves may be subjected to less stress than in the prior construction as a result of the provision of the circuit board engaging feet 35 and 36 which support the base-plate suitably spaced from the circuit board, thereby avoiding undesirable transfer of soldering heat thereto and permitting washing thereunder. The location of the chip carrier supporting projections or stand-offs 34 diagonally aligned and adjacent respective feet 35 also ensures that sufficient support is provided both for the chip carrier if inserted unevenly into the socket and for the base-plate.

In addition, as the bridges extend substantially in the plane of the circuit board there is a diminished risk of solder flowing under the bridges themselves with possible undetected attachment thereto.

As the soldering tool admitting apertures 22' are unobstructed by the bridges more space is available for access of a corrective soldering tool, facilitating speedy and effective quality control procedures.

I claim:

1. A chip carrier socket comprising:
   an insulating housing molded in one piece of plastic material nd including a rectangular frame-like body portion surrounding a centrally located chip carrier support, providing a chip carrier receiving recess defined by the profile of the frame-like body above the support, the frame-like body portion having sides formed with respective rows of contact receiving cavities;
   contacts each comprising a contact portion and a solder tab portion and being anchored in respective cavities with rows of the contact portions extending inwardly of the frame-like body portion for establishing electrical connection to respective leads of rows of leads on respective sides of a rectangular chip carrier received in the chip carrier receiving recess and with soldering tabs of the contacts extending inwardly of the frame-like body portion and located closely adjacent in rows at a circuit board engaging face for soldered connection to respective soldering pads of the circuit board by reflow soldering;
   bridge portions extending from locations of the framelike body portion adjacent respective corners thereof, and between respective adjacent ends of adjacent rows of soldering tabs, to respective adjacent locations of the chip carrier support, locating the chip carrier support with respective perimetrical edges thereof spaced apart from the respective adjacent sides of the frame body and defining therewith apertures aligned over the solder tabs, one aperture per row, so that the field of view of each row of soldering tabs through a corresponding aperture is unobstructed whereby all soldering tabs in a row and spaces between adjacent soldering the of the row can be seen through the aperture aligned thereover.

2. A chip carrier socket according to claim 1 in which the chip carrier support is spaced above the circuit board engaging face.

3. A chip carrier socket according to claim 2 in which the chip carrier support is a rectangular plate.

4. A chip socket carrier according to claim 2 in which feet depend from a central location on the chip carrier support.

5. A chip socket carrier according to claim 7 in which stand-offs upstand from the chip carrier support at locations adjacent respective bridge portions.

6. A chip carrier socket according to claim 2 in which the housing includes circuit board engaging feet for supporting the chip carrier support and frame-like body portion at a predetermined spacing above the surface of a circuit board.

7. A chip carrier socket according to claim 6 in which at least some of the feet are located on the housing adjacent respective corners thereof.

8. A chip carrier socket according to claim 6 in which at lest some feet are integrally joined to the bridge portions.

9. A chip carrier socket according to claim 8 in which the said at least some feet form continuations of the bridge portions to which they are integrally joined.

10. A chip carrier socket according to claim 9 in which the continuations extend diagonally of the housing.

11. A chip carrier socket comprising an insulating housing molded in one piece of plastic material and including a rectangular frame-like body portion surrounding a centrally located chip carrier support, the frame-like body portion having sides formed with respective rows of contact receiving cavities;
   contacts each comprising a contact portion and a solder tab portion and being anchored in respective cavities with rows of the contact portions extending inwardly of the frame-like body portion for establishing electrical connection to respective leads of rows of leads on respective sides of a rectangular chip carrier received in the chip carrier receiving recess and with soldering tabs of the contacts extending inwardly of the frame-like body portion and located closely adjacent in rows at a circuit board engaging face for soldered connection to respective soldering pads of the circuit board by reflow soldering;
   bridge portions extending from locations of the frame-like body portion adjacent respective corners thereof, and between respective adjacent ends of adjacent rows of soldering tbs, to respective adjacent locations of the chip carrier support, locating the chip carrier support with respective perimetrical edges thereof spaced apart from the respective adjacent sides of the frame body and defining therewith apertures aligned over the solder tabs, one aperture per row, so that the field of view of each row of soldering tabs through a corresponding apertures unobstructed whereby all soldering tbs in a row and spaces between adjacent soldering tabs of the row can be seen through the aperture aligned thereover.

12. A chip carrier socket comprising:

an insulating housing molded in one piece of plastic material and including a rectangular, frame-like body portion surrounding a centrally located chip carrier support, providing a chip carrier receiving recess defined by the profile of the frame-like body above the support;

contacts each comprising a contact portion and a solder tab portion and being anchored in respective sides of the body portion with rows of the contact portions extending inwardly of the portion for establishing electrical connection to respective leads of rows of leads on to respective sides of a rectangular chip carrier received in the chip carrier receiving recess and with soldering tabs of the contacts extending inwardly of the body portion and located closely adjacent in rows at a circuit board mounting face or soldered connection to respective soldering pads of the circuit board by reflow soldering;

bridge portions extending rom locations of the body portion adjacent respective corners thereof, and between respective adjacent ends of adjacent rows of soldering tabs, respective adjacent locations of the chip carrier support, locating the chip carrier support with respective perimetrical edges thereof spaced apart from the respective adjacent sides of the body portion and defining therewith apertures aligned over the solder tabs, one aperture per row, so that the field of view of each row of soldering tbs through a corresponding aperture is unobstructed whereby all soldering tabs in a row and spaces between adjacent soldering tabs of the row can be seen through the aperture aligned thereover.

* * * * *

UNITED STATES PATENT AND TRADEMARK OFFICE
CERTIFICATE OF CORRECTION

PATENT NO. : 5,177,671

DATED : January 5, 1993

INVENTOR(S) : Kiyoshi Atoh

It is certified that error appears in the above-identified patent and that said Letters Patent is hereby corrected as shown below:

```
Column 5; Line 40, "nd" should read --and--

Column 6; Line 27, "lest" should read --least--

Column 6; Line 57, "tbs" should read --tabs--

Column 8; Line 3, "rom" should read --from--

Column 8; Line 13, "tbs" should read --tabs--
```

Signed and Sealed this

Twenty-seventh Day of April, 1993

Attest:

MICHAEL K. KIRK

Attesting Officer

Acting Commissioner of Patents and Trademarks